US009601901B2

(12) United States Patent
Caneau et al.

(10) Patent No.: US 9,601,901 B2
(45) Date of Patent: *Mar. 21, 2017

(54) PASSIVE WAVEGUIDE STRUCTURE WITH ALTERNATING GAINAS/ALINAS LAYERS FOR MID-INFRARED OPTOELECTRONIC DEVICES

(71) Applicant: Thorlabs Quantum Electronics, Inc., Jessup, MD (US)

(72) Inventors: Catherine Genevieve Caneau, Corning, NY (US); Feng Xie, Painted Post, NY (US); Chung-En Zah, Holmdel, NJ (US)

(73) Assignee: THORLABS QUANTUM ELECTRONICS, INC., Jessup, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/985,776

(22) Filed: Dec. 31, 2015

(65) Prior Publication Data

US 2016/0197454 A1 Jul. 7, 2016

Related U.S. Application Data

(63) Continuation of application No. 14/628,394, filed on Feb. 23, 2015, now Pat. No. 9,231,368.

(Continued)

(51) Int. Cl.
*H01S 5/026* (2006.01)
*H01S 5/34* (2006.01)
(Continued)

(52) U.S. Cl.
CPC ............ *H01S 5/026* (2013.01); *H01S 5/0208* (2013.01); *H01S 5/06256* (2013.01); *H01S 5/2031* (2013.01); *H01S 5/3402* (2013.01)

(58) Field of Classification Search
CPC .... H01S 5/026; H01S 5/06256; H01S 5/0208; H01S 5/3402
See application file for complete search history.

(56) References Cited

U.S. PATENT DOCUMENTS 6,331,908 B1 * 12/2001 Adams ............... H04B 10/2537
372/50.11
6,649,938 B1 11/2003 Bogatov et al.
(Continued)

FOREIGN PATENT DOCUMENTS

EP 1182758 A2 2/2002
EP 1863140 A1 12/2007
(Continued)

OTHER PUBLICATIONS

International Search Report with Written Opinion, mailed Dec. 29, 2015, for corresponding international application PCT/US/2015/017022.

(Continued)

*Primary Examiner* — Dung Nguyen
(74) *Attorney, Agent, or Firm* — Graham Curtin, P.A.

(57) ABSTRACT

Disclosed is a semiconductor optical emitter having an optical mode and a gain section, the emitter comprising a low loss waveguide structure made of two alternating layers of semiconductor materials A and B, having refractive indexes of Na and Nb, respectively, with an effective index $N_o$ of the optical mode in the low loss waveguide between Na and Nb, wherein No is within a 5% error margin of identical to a refractive index of the gain section and wherein the gain section is butt-jointed with the low loss waveguide, and wherein the size and shape of the optical mode(s) in the low loss waveguide and gain section are within a 10% error margin of equal. Desirably, at least one of the semiconductor materials A and B has a sufficiently large band gap that the (Continued)

passive waveguide structure blocks current under a voltage bias of 15 V.

13 Claims, 5 Drawing Sheets

Related U.S. Application Data

(60) Provisional application No. 61/946,700, filed on Feb. 28, 2014.

(51) Int. Cl.
*H01S 5/02* (2006.01)
*H01S 5/20* (2006.01)
*H01S 5/0625* (2006.01)

(56) References Cited

U.S. PATENT DOCUMENTS

| | | | |
|---|---|---|---|
| 9,231,368 B2 * | 1/2016 | Caneau | H01S 5/026 |
| 2002/0037025 A1 * | 3/2002 | Bartman | H01S 5/141 |
| | | | 372/50.11 |
| 2002/0051615 A1 * | 5/2002 | Walpole | H01S 5/223 |
| | | | 385/131 |
| 2003/0231686 A1 | 12/2003 | Liu | |
| 2005/0111079 A1 | 5/2005 | Wang et al. | |
| 2009/0127570 A1 | 5/2009 | Tamai et al. | |
| 2012/0236890 A1 | 9/2012 | Caneau et al. | |
| 2013/0221223 A1 | 8/2013 | Caneau | |

FOREIGN PATENT DOCUMENTS

| | | |
|---|---|---|
| RU | 2134007 C1 | 7/1999 |
| WO | 2006031984 A2 | 3/2006 |
| WO | 2013142481 A2 | 9/2013 |

OTHER PUBLICATIONS

Wanke, Michael C., et al.; "Terahertz quantum cascade laser integration with on-chip micromachined rectangular waveguides," Proceedings of SPIE, vol. 7215, Feb. 9, 2009, p. 721504, XP55104850.

* cited by examiner

PASSIVE WAVEGUIDE STRUCTURE WITH ALTERNATING GAINAS/ALINAS LAYERS FOR MID-INFRARED OPTOELECTRONIC DEVICES

CROSS-REFERENCE TO RELATED APPLICATIONS

This application is a continuation of U.S. patent application Ser. No. 14/628,394, filed on Feb. 23, 2015, which claims the benefit of U.S. Provisional Patent Application No. 61/946,700 filed on Feb. 28, 2014, the contents of each being incorporated herein by reference.

This application is also related to Provisional Application Ser. No. 61/732,289 filed on Nov. 30, 2012, and to Application No. PCT/US2013/072195 filed on Nov. 27, 2013, the contents of each being incorporated herein by reference.

FIELD OF THE INVENTION

The present specification generally relates to quantum cascade lasers ("QCLs") and particularly to passive waveguide structures for use in QCLs and to QCLs using such structures.

TECHNICAL BACKGROUND

A quantum cascade laser is a unipolar device. It utilizes intersubband transitions, unlike the traditional direct band gap semiconductor lasers, and it usually emits in the mid-infrared ("mid-IR") or far-infrared ("far-IR") wavelength range.

Mid-IR sources are of interest for various reasons. Strong absorption lines in the mid-IR region from the vibration of chemical bonds can be used to identify molecular composition. For example, FIG. 1 (prior art) shows a strong absorption line of $CO_2$ near 4.3 um. A single wavelength Mid-IR light source such as a QCL can be used to detect gas molecules such as $CO_2$ by detecting the absorption of a characteristic wavelength such as 4.3 um.

To achieve single wavelength emission, grating structures may be added to the QCL in the active region to make a distributed-feedback ("DFB") quantum-cascade laser ("DFB QCL"). DFB QCLs generally emit a single wavelength and can only be tuned over a small wavelength range, which allows them to be used to detect a single species of small gas molecule such as $CO_2$. However, some big molecules in solid or liquid phases have wide and/or complex absorption spectra, like the explosive substances in FIG. 2, for example, which shows infrared absorption spectra for PETN 102, RDX 104, TATP 106 and TNT 108. For detecting and differentiating substances with such wide and/or complex absorption spectra, QCLs with both single wavelength emission and wide tuning range are desirable. Range R indicated in the figure, for example, may be used to detect, and differentiate among, the spectra shown.

External cavity QCLs can have both single wavelength emission and wide tuning range, but they are usually expensive and bulky. A distributed Bragg reflector ("DBR") QCL has one or both reflective gratings outside the gain region of the laser, allowing for a more independent thermal tuning of the gratings and a wider tuning range than a DFB QCL. A DBR QCL is thus a potential alternative to external cavity QCLs with the advantages of relatively low cost and a compact, robust, monolithic form.

DBR QCLs typically have an essentially uniform, common core, as shown in FIG. 3 (prior art). The grating layers on DBR sections are formed directly on the layer(s) of the common core. Since the region of common core under the DBR is passive in operation (not part of the gain region) receiving no or minimal pump current during operation (due to additional associated current blocking structures or the like), it has relatively strong resonant absorption.

Implementing a waveguide different from the waveguide of the active region in a DBR QCLs is disclosed in the related applications referenced above. By using for the DBRs a different waveguide transparent (or at least more transparent than the active region waveguide) to wavelengths in the operating wavelength range, absorption losses in the DBRs can be reduced, allowing higher maximum power and wider total tuning (lasing) range in the laser device.

SUMMARY

To provide the benefits described above of including in a DBR QCL a transparent waveguide as well as to provide for similar benefits of a transparent waveguide in other semiconductor active optical devices, the present disclosure includes a transparent (or relatively transparent) waveguide structure made of two alternating layers of semiconductor materials A and B, which have refractive indexes of $N_a$ and $N_b$. Desirably, at least one of A and B should have a relatively large band gap so that the passive waveguide structure can block electric current very well, even under relatively high voltage bias. The effective index of the optical mode in the passive waveguide $N_o$ will be in-between $N_a$ and $N_b$; for good propagation of the optical mode, $N_o$ should be equal (or close) to the refractive index in an associated gain section which is butt-jointed with the passive waveguide. Also for good propagation of the optical mode, the size of the optical mode(s) in the passive and gain section should be equal or reasonably so.

An embodiment of the invention provides a semiconductor optical emitter having an optical mode and a gain section, the emitter including a low loss waveguide structure made of two alternating layers of semiconductor materials A and B, having refractive indexes of $N_a$ and $N_b$, respectively, with an effective index $N_o$ of the optical mode in the low loss waveguide between $N_a$ and $N_b$, wherein $N_o$ is within a 5% error margin of identical to a refractive index of the gain section and wherein the gain section is butt-jointed with the low loss waveguide, and wherein the size and shape of the optical mode(s) in the low loss waveguide and gain section are within a 10% error margin of equal.

These and other features and advantages will be apparent from the specification and the drawings to those of skill in the art.

DETAILED DESCRIPTION

Figure 1:
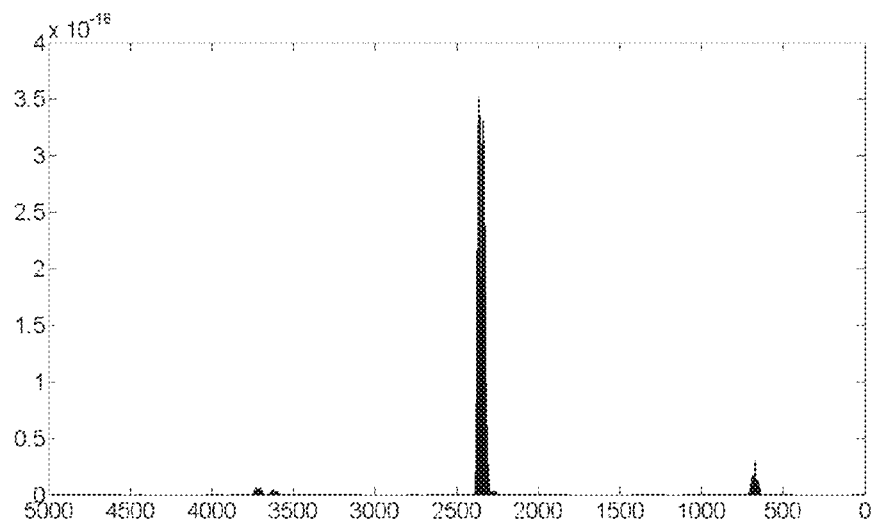
FIG. 1 (Prior Art) is a graph of absorption spectrum for $CO_2$ in the infrared.
Figure 3:
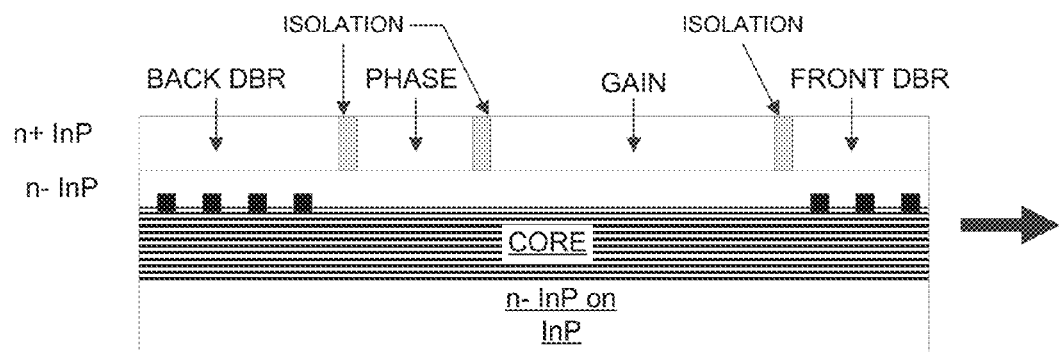
FIG. 3 (Prior Art) is a cross-sectional schematic diagram of a DBR QCL.
Figure 2:
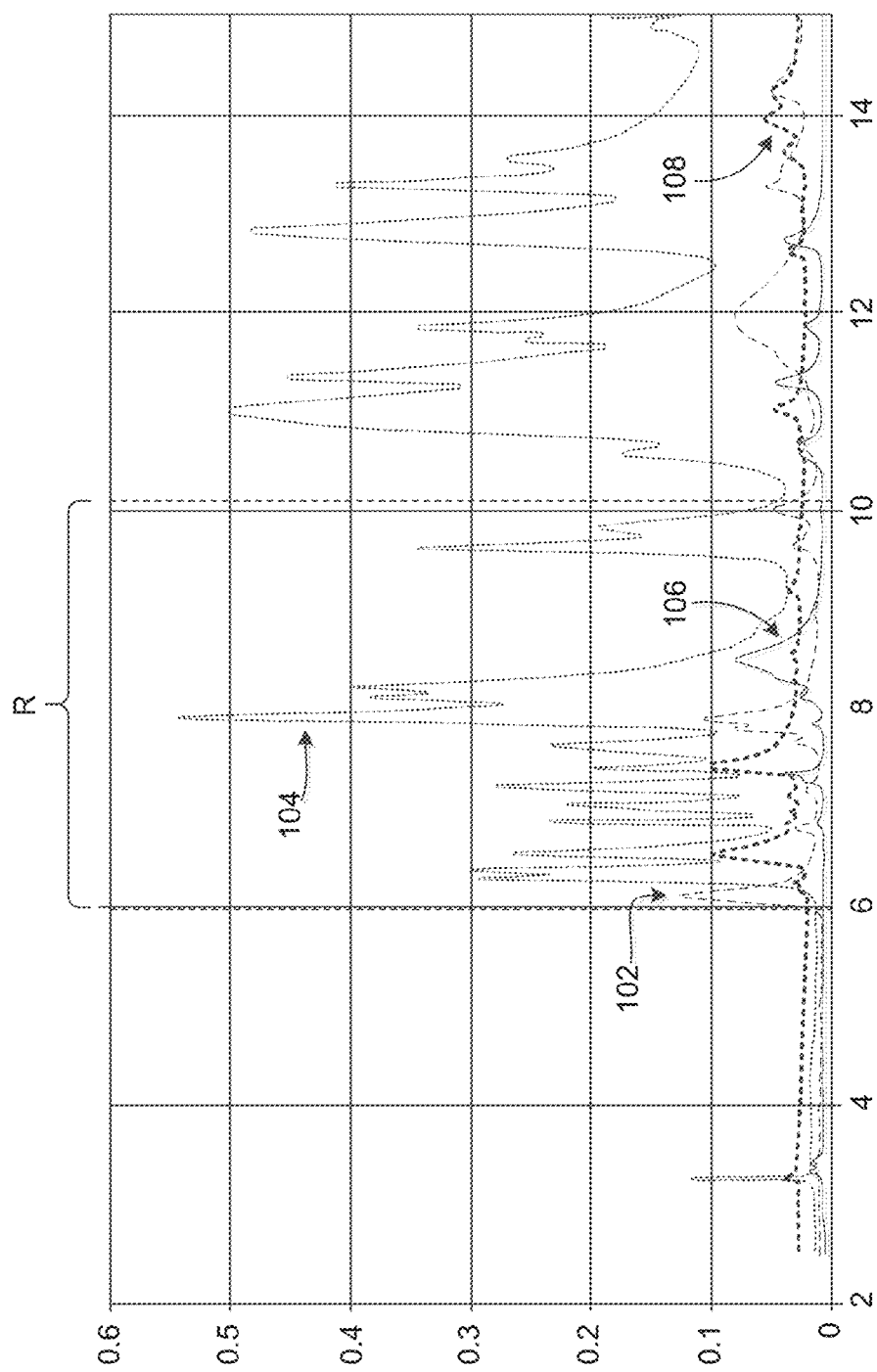
FIG. 2 (Prior Art) is a graph of absorption spectra of various explosive compositions in the infrared.

The present invention can be understood more readily by reference to the following detailed description, drawings, examples, and claims, and their previous and following description. However, before the present compositions, articles, devices, and methods are disclosed and described, it is to be understood that this invention is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its currently known embodiments. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F, and an example of a combination embodiment, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and/or C; D, E, and/or F; and the example combination A-D. Likewise, any subset or combination of these is also specifically contemplated and disclosed. Thus, for example, the subgroup of A-E, B-F, and C-E are specifically contemplated and should be considered disclosed from disclosure of A, B, and/or C; D, E, and/or F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific embodiment or combination of embodiments of the disclosed methods, and that each such combination is specifically contemplated and should be considered disclosed.

In this specification and in the claims which follow, reference will be made to a number of terms which shall be defined to have the following meanings:

"Include," "includes," or like terms means encompassing but not limited to, that is, inclusive and not exclusive.

The term "about" references all terms in the range unless otherwise stated. For example, about 1, 2, or 3 is equivalent to about 1, about 2, or about 3, and further comprises from about 1-3, from about 1-2, and from about 2-3. Specific and preferred values disclosed for compositions, components, ingredients, additives, and like aspects, and ranges thereof, are for illustration only; they do not exclude other defined values or other values within defined ranges. The compositions and methods of the disclosure include those having any value or any combination of the values, specific values, more specific values, and preferred values described herein.

The indefinite article "a" or "an" and its corresponding definite article "the" as used herein means at least one, or one or more, unless specified otherwise.

The present disclosure includes a transparent waveguide structure (or relatively transparent, relative to a non-energized active or gain section waveguide) made of two alternating layers of semiconductor materials A and B, which have refractive indexes of $N_a$ and $N_b$. Desirably, at least one of A and B should have a relatively large band gap so that the passive waveguide structure can block electric current very well, even under relatively high voltage bias. The effective index of the optical mode in the passive waveguide $N_o$ will be in-between $N_a$ and $N_b$; for good propagation of the optical mode, $N_o$ should be equal (or close) to the refractive index in an associated gain section which is butt-jointed with the passive waveguide. Also for good propagation of the optical mode, the size of the optical mode(s) in the passive and gain section should be equal or reasonably so.

In the case of Mid-IR-emitting QCLs grown on InP substrates, the transparent waveguide core should be (on average) lattice-matched to InP, using compounds, such as AlGaInAs or GaInAsP or AlGaIn(P)Sb, with the composition(s) being adjusted for the desired refractive index (matching the corresponding active or non-transparent waveguide) and for lattice-matching to InP. For a rather short wavelength emitting QCL core ($\lambda$=4.5 μm), GaInAsP or AlGaInAs with a room temperature bandgap of about 0.95-1 eV (corresponding to a photoluminescence wavelength around 1.28 μm) has the appropriate refractive index, but for a QCL core emitting around $\lambda$=10-11 μm, the bandgap of the appropriate GaInAsP or AlGaInAs material should be around 0.8-0.9 eV (corresponding to a photoluminescence wavelength around 1.45 μm).

Regarding providing the desirable insulating or semi-insulting nature of the transparent waveguide, InP and AlInAs can be grown semi-insulating. Although AlInAs has been grown semi-insulating at low growth temperature, whether taking advantage of native defects or of C contamination, AlInAs is usually grown semi-insulating by the addition of dopant atoms such as Fe, Ti, Ru or other transition metals, which create deep traps which trap free carriers; this is also the case for InP. It has been shown (see, for examples, [B. Tell, U. Koren and B. I. Miller, Metalorganic vapor-phase-epitaxial growth of Fe-doped In0.53Ga0.47As, J. Appl. Phys 61, 1172, 1987], [D. G. Knight, W. T. Moore and R. A. Bruce, Growth of semi-insulating InGaAsP alloys using low pressure MOCVD, J. Crystal Growth 124, 352, 1992]) that GaInAsP with low bandgap (<0.8-0.9 eV) is difficult to dope for semi-insulating qualities; if semi-insulating at room temperature, it becomes conducting at higher temperature (400 K), which is the temperature at which a QCL core is likely to operate. However, the indices of InP and AlInAs are too low to match the index of the laser's active core. So they cannot act as the core material of a passive waveguide.

The solution to this particular problem provided by the present disclosure is to use as a transparent waveguide not a homogeneous material but a stack of AlInAs and GaInAs layers. The GaInAs is left undoped while the AlInAs is desirably doped with a deep trap element. Undoped AlInAs as grown in an reactor is lightly n-type, and it is accordingly chosen as dopant Fe, which acts as trap for electrons. If the thickness of semi-insulating material is high enough (0.5 µm for example), tunneling through it does not occur and the resulting stack is insulating enough. As alternative embodiments, different stacks could be chosen, such as GaInAs/InP; AlGaInAs/AlGaInAs or GaInAsP/GaInAsP—of different compositions, low bandgap/high bandgap—or another combination.

Figure 4A:
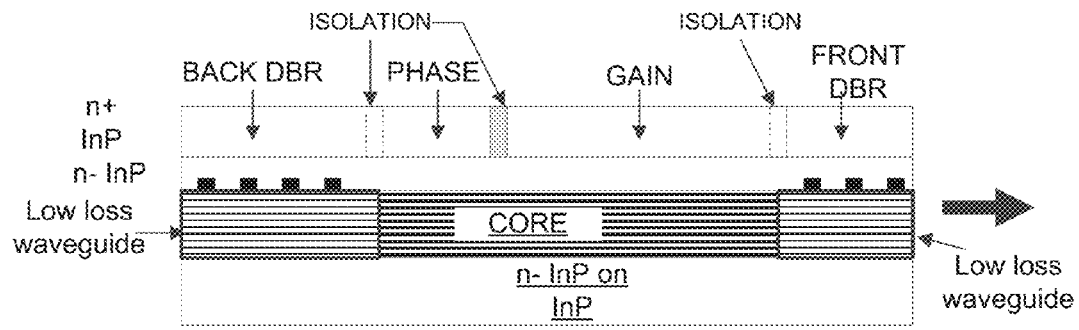
FIGS. 4A, 4B and 4C are schematic cross-sectional views of various alternative aspects of certain embodiments of a device according to the present disclosure.
Figure 4B:
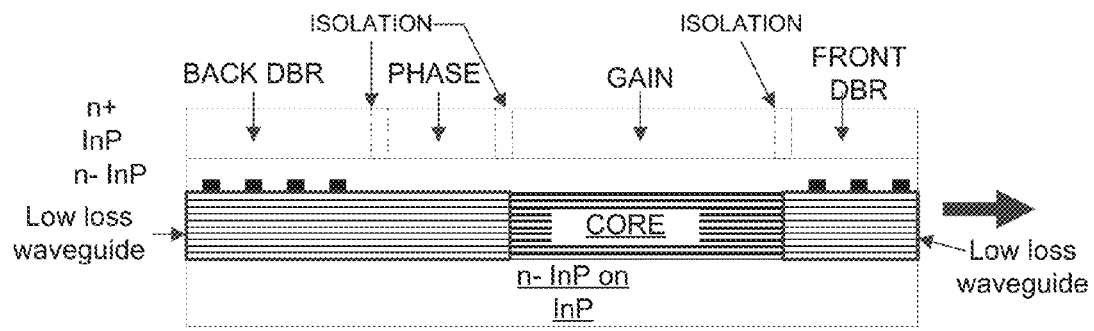
Figure 4C:
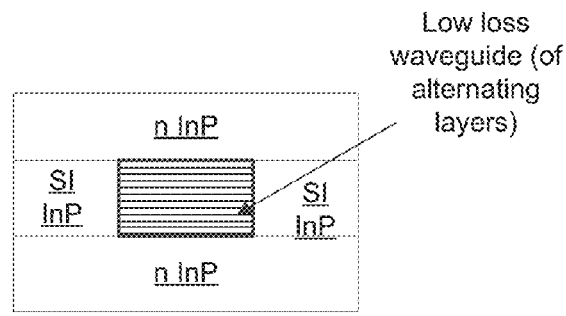

A transparent or low loss passive waveguide structure with a core made of alternating undoped (or doped for semi-insulating behavior) GaInAs/AlInAs layers, is shown in FIG. 4C. The core is sandwiched between top and bottom InP cladding layers (n⁻ doped) (note that the n with the superscript "−" is generally understood in the art as low n type doping), like a QCL active core. The ratio of the thicknesses of GaInAs and AlInAs is designed in such a way that the effective index of the optical mode in the passive waveguide equals that in the waveguide with QCL laser core. When AlInAs is appropriately doped for semi-insulating behavior, the core of the passive waveguide can block electric current up to certain voltage bias (>20 V), so that no leakage current can go through the passive waveguide. Therefore no additional current blocking (isolation) structures are needed, and the fabrication of the devices can be simplified.

As seen in FIG. 4A, the low loss waveguide may be used for the front and rear DBR gratings. As seen in the alternative of FIG. 4B, the low loss waveguide may also be used for the phase section, if desired (and if the phase section is controlled via a microheater rather than current injection, in the case the low loss waveguide is insulating (that is, semi-insulating).

The passive waveguide will have low optical loss according to the present disclosure, which is mostly due to reduced free carrier absorption. Since the GaInAs/AlInAs material is either undoped or is doped to produce semi-insulating characteristics, the optical loss in the low-loss waveguide core is negligible. The effective refractive index of the passive waveguide can be adjusted between 3.1 (the refractive index of AlInAs) and 3.3 (the refractive index of GaInAs), by changing the ratio of the thicknesses of AlInAs and GaInAs. Therefore the effective index of the passive waveguide can be easily designed to match the effective index of the optical mode in the active (light-emitting) waveguide (core). The passive waveguide according to this embodiment, when the AlInAs layers in the waveguide structure are doped to be semi-insulating, can block electric current up to high voltage bias (>20 V). This can further simplify the device manufacturing process because no additional isolation may be needed, such that the isolation regions shown in FIGS. 4A and 4B are optional or omitted.

The currently most preferred embodiment of the present disclosure is a low optical loss passive waveguide core structure which can be used in Mid-IR opto-electronic devices, especially in combination with QCL active materials. This is particularly useful in the case of laser with a relatively thick active region emitting at long wavelengths, such as a QCL emitting in the Mid-IR range and beyond.

For some devices, a waveguide core section (or sections) butt-jointed with an active (=light-emitting) core section (or sections) is desirable. The waveguide core material is chosen so that the optical mode propagates with as little loss as possible at the butt-joint. This is partly a problem of growth; in addition, though, the material of the waveguide core is desirably chosen for an appropriate refractive index, usually identical to the index of the active core. If the waveguide core is undoped or low-doped, propagation loss through the waveguide will include no or very little free-carrier absorption. As noted, in some embodiments, it would also be very advantageous if the waveguide core were not simply undoped but were semi-insulating so that current injected into the active core not leak into the waveguide and not be wasted.

Figure 5A:
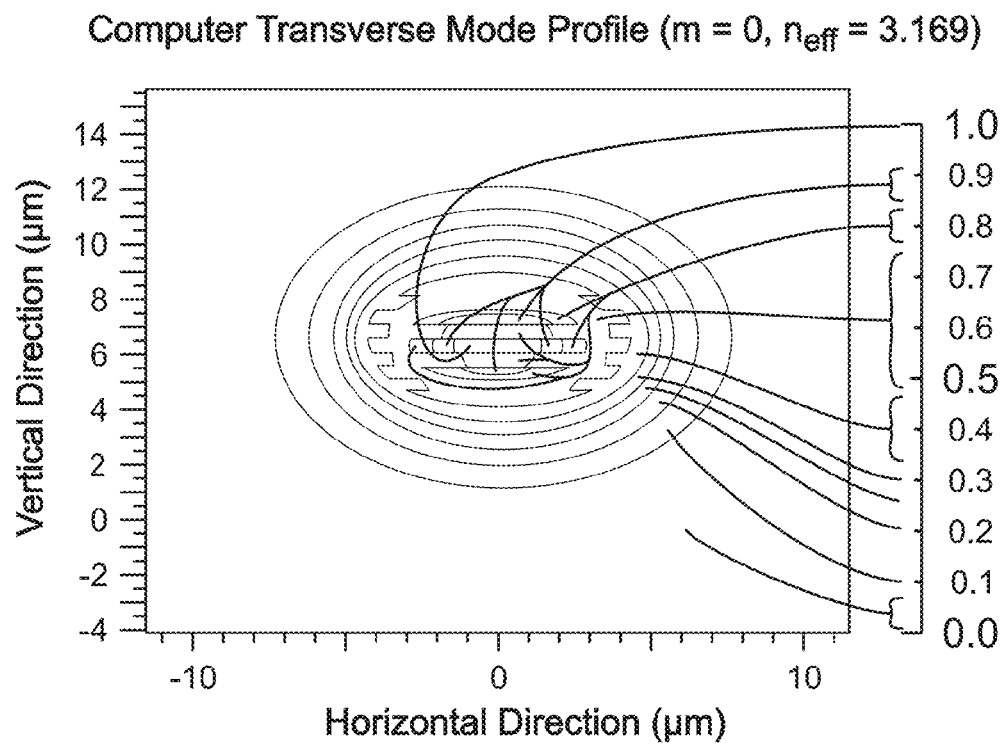
FIGS. 5A and 5B are graphs of the optical mode profiles of some embodiments of structures according to the present disclosure, as generated by computer simulation.
Figure 5B:
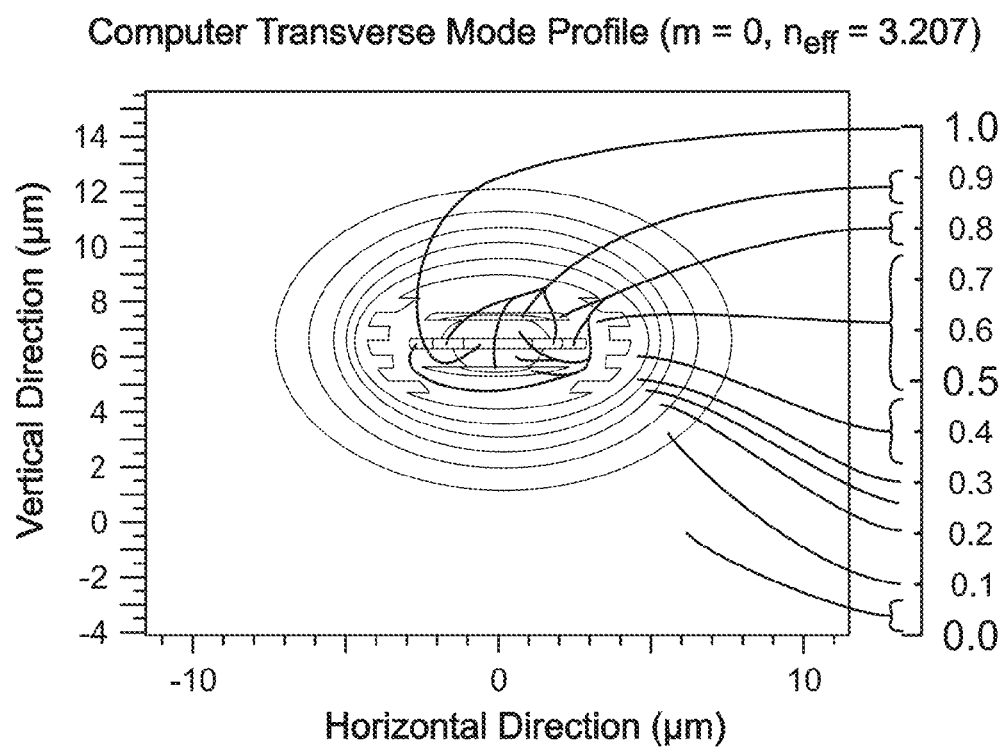

Therefore, a desirable low loss waveguide structure has a core made of alternating undoped (or Iron doped) GaInAs/AlInAs layers, as shown in FIG. 4C. The core is sandwiched between top and bottom InP cladding layers (n⁻ doped), like the QCL core. The total thickness of the passive waveguide core is equal to that of the QC laser core. The thickness of a pair of GaInAs/AlInAs should be larger than 0.1 µm. The ratio of the thicknesses of GaInAs and AlInAs is designed in such a way that the effective index of the optical mode in the passive waveguide equals that in the waveguide with QC laser core; the ratio of thicknesses also will be larger than 1% and smaller than 99% (not one pure material)—this fact is due to the range of refractive indices aimed for. The size of the optical mode in the passive waveguide should be similar to that in the waveguide with QC laser core. FIGS. 5A and 5B show the simulated optical mode of two passive waveguides with different thickness ratios. FIG. 5A shows the optical mode in the passive waveguide structure with a GaInAs/AlInAs thickness ratio of 50/50. Here, a pair of GaInAs and AlInAs layers has a thickness of 0.5 µm. The effective index is 3.169, which is slightly lower than the target value (index of the mode in a particular QCL active section) of 3.2172. FIG. 5B shows the optical mode according to simulation in the passive waveguide structure with a GaInAs/AlInAs ratio of 68/32. The effective index is 3.207, which matches the particular active core's effective index reasonably well.

Figure 6:
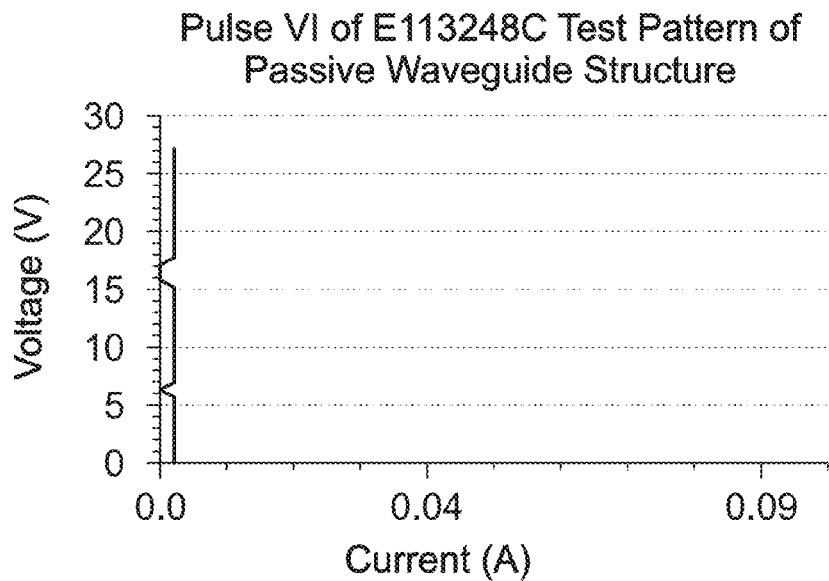
FIG. 6 is a graph of a pulsed V/I curve test of an embodiment of a passive waveguide structure according to the present disclosure.

The low-loss waveguide embodiment with doping can block electric current with high voltage bias (>20 V), thanks to its containing thick enough AlInAs layers, which are grown doped to be semi-insulating. FIG. 6 shows a test voltage-current (VI) curve of a square mesa of a passive waveguide structure with such doping. It shows no obvious leakage current up to a voltage bias higher than 25 V.

Figure 7:
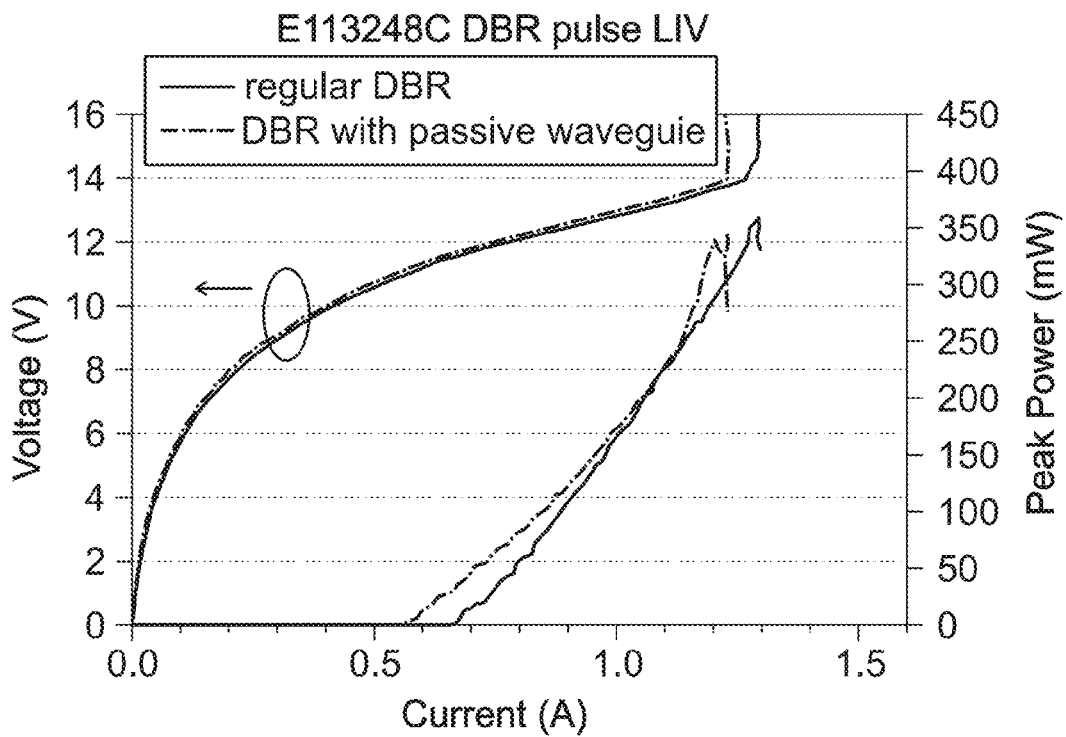
FIG. 7 is a graphed curve of a pulsed LIV test for a DBR QCL with a passive waveguide structure according to the present disclosure and a comparative DBR QCL.

A DBR QCL wafer with this passive waveguide structure was made. On one individual wafer, both a regular DBR QCL (a QCL having the same active waveguide in the gain and the DBR sections) and DBR QCL with passive waveguide (using the passive waveguide core to replace the QCL core in the front and back DBR sections) were fabricated. FIG. 7 shows the light-current-voltage (LIV) curves of a DBR QCL with passive waveguide and those of a regular DBR QCL from the same wafer and with the same stripe width. The LIVs are similar. Since this is the first such wafer grown, the fabrication (especially at the transition area [the butt joint] between the gain and DBR sections) is not perfect. The data shown here are thus only preliminary results. High output power and possible wider tuning range are expected in the future with the DBR QCL with the passive waveguide. But what is seen is that lasing can be achieved at lower voltages, even in this first attempt.

Embodiments herein are desirably used in a pulsed mode, but continuous-wave mode may be useful in some applications. Laser pulse duration may be from about 1 ns to about 1 ms. In some embodiments, the pulse width at FWHM is about 1 ns, 2 ns, 3 ns, 4 ns, 5 ns, 6 ns, 7 ns, 8 ns, 9 ns, 10 ns, 20 ns, 50 ns, 60 ns, 70 ns, 80 ns, 90 ns, 100 ns, 200 ns, 300 ns, 400 ns, 500 ns, 600 ns, 700 ns, 800 ns, 900 ns, 1 µs, 10 µs, 100 µs, or 1 ms. In some embodiments, devices embodied herein may be designed to fire all laser sections simultaneously, individually, and/or in a sequential or programmed order.

Embodiments may be used in any number of methods wherein IR radiation, and particular IR laser radiation would be advantageous. Particular applications include IR absorbance or reflectance measurements, IR and FTIR spectroscopies, Raman spectroscopy, gas and/or chemical weapons detection, chemical dynamics and kinetics measurements, thermal experiments, etc. In one embodiment, the embodiments are used in IR absorbance measurements to identify molecular compositions.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A semiconductor optical emitter having an optical mode and a gain section, the emitter comprising a low loss waveguide structure made of alternating layers of at least two semiconductor materials A and B, having refractive indexes of $N_a$ and $N_b$, respectively, with an effective index $N_o$ of the optical mode in the low loss waveguide between $N_a$ and $N_b$, wherein a ratio of thicknesses of the materials A and B is selected in order to form the low loss waveguide with the effective index $N_o$ that is within a desired error margin of identical to a refractive index of the gain section.

2. The emitter of claim 1 wherein at least one of the semiconductor materials A and B has a sufficiently large band gap that the passive waveguide structure blocks current under a voltage bias of 15 V.

3. The emitter of claim 1 wherein at least one of the semiconductor materials A and B has a sufficiently large band gap that the passive waveguide structure blocks current under a voltage bias of 20 V.

4. The emitter of claim 1 wherein at least one of the semiconductor materials A and B has a sufficiently large band gap that the passive waveguide structure blocks current under a voltage bias of 25 V.

5. The emitter of claim 1 wherein material A is AlInAs and material B is GaInAs.

6. The emitter of claim 5 wherein the AlInAs and the GaInAs are left undoped.

7. The emitter of claim 5 wherein the GaInAs is left undoped and the AlInAs is doped with a deep trap element or elements.

8. The emitter of claim 7 wherein the deep trap element or elements is one, or a combination, of iron and titanium.

9. The emitter of claim 7 wherein the deep trap element is iron.

10. The emitter of claim 7 wherein the deep trap element is Ruthenium.

11. The emitter of claim 1 wherein No is within a 5% error margin of identical to a refractive index of the gain section.

12. The emitter of claim 1 wherein the gain section is butt-jointed with the low loss waveguide.

13. The emitter of claim 1 wherein the size and shape of the optical mode(s) in the low loss waveguide and gain section are within a 10% error margin of equal.

* * * * *